US006511335B1

(12) United States Patent
Rayssiguier et al.

(10) Patent No.: US 6,511,335 B1
(45) Date of Patent: Jan. 28, 2003

(54) MULTI-CONTACT, WET-MATEABLE, ELECTRICAL CONNECTOR

(75) Inventors: Christophe Rayssiguier, Houston, TX (US); Kalim Ullah, Houston, TX (US); Gary P. Bickford, Houston, TX (US); Robert Martinez, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 48 days.

(21) Appl. No.: 09/656,686

(22) Filed: Sep. 7, 2000

(51) Int. Cl.[7] .................................................. H10R 4/60
(52) U.S. Cl. .......................... 439/191; 439/199; 385/56
(58) Field of Search ................................ 439/190–191, 439/194, 199, 201, 271, 275, 181, 668, 669; 166/65.1, 319; 385/56, 75, 139; 350/96.21

(56) References Cited

U.S. PATENT DOCUMENTS

| | | | | |
|---|---|---|---|---|
| 4,039,242 A | | 8/1977 | Wilson et al. | |
| 4,174,875 A | | 11/1979 | Wilson et al. | |
| 4,192,569 A | | 3/1980 | Mucci | |
| 4,452,310 A | | 6/1984 | Pringle et al. | |
| 4,500,155 A | | 2/1985 | Chevalier | |
| 4,500,156 A | | 2/1985 | Chevalier | |
| 4,589,717 A | | 5/1986 | Pottier et al. | |
| 4,606,603 A | * | 8/1986 | Cairns | 350/96.21 |
| 4,767,349 A | | 8/1988 | Pottier et al. | |
| 4,795,359 A | | 1/1989 | Alcock et al. | |
| 5,052,941 A | | 10/1991 | Hernandez-Marti et al. | |
| 5,131,464 A | | 7/1992 | Lenhart et al. | |
| 5,358,418 A | | 10/1994 | Carmichael | |
| 5,389,003 A | | 2/1995 | Van Steenwyk et al. | |
| 5,484,296 A | | 1/1996 | Taylor | |
| 5,645,438 A | | 7/1997 | Cairns | |
| 5,645,442 A | | 7/1997 | Cairns | |
| 5,722,842 A | | 3/1998 | Cairns | |
| 5,772,457 A | | 6/1998 | Cairns | |
| 5,810,048 A | | 9/1998 | Zeiner-Gundersen | |
| 5,820,416 A | | 10/1998 | Carmichael | |
| 6,315,461 B1 | * | 11/2001 | Cairns | 385/56 |

FOREIGN PATENT DOCUMENTS

| | | |
|---|---|---|
| GB | 2011193 A | 7/1979 |
| GB | 2192316 A | 1/1988 |
| WO | WO 89/07843 | 8/1989 |
| WO | WO 91/15882 | 10/1991 |

* cited by examiner

*Primary Examiner*—Renee Luebke
*Assistant Examiner*—Phuongchi Nguyen
(74) *Attorney, Agent, or Firm*—Wayne I. Kanak; Brigitte L. Jeffery; John J. Ryberg

(57) ABSTRACT

A wet-mateable electrical connector which does not use elastomer as a primary seal is provided. The wet-mateable electrical connector includes a female connector body having an internal central cavity and a female metal sealing surface at a forward end and a female contact housing disposed within the internal central cavity. The female contact housing includes a plurality of female contacts. A sliding pin is movably disposed within the internal central cavity. The wet-mateable electrical connector further includes a male contact pin which has a front end for engagement with a front end of the sliding pin. The male contact pin includes a plurality of male contacts, each of which engages with a respective one of the female contacts so as to establish an electrical connection. The male contact pin has a male metal sealing surface which sealingly engages the female sealing surface to form a metal-to-metal seal.

42 Claims, 4 Drawing Sheets

MULTI-CONTACT, WET-MATEABLE, ELECTRICAL CONNECTOR

BACKGROUND OF THE INVENTION

1. Field of the Invention

The invention relates to an electrical connector for use in providing power and data communications to electrical devices disposed in a wellbore.

2. Background Art

The completion phase of a well drilled through a petroleum reservoir normally starts with setting a production casing or liner in the well, and pumping completion fluid or drilling fluid into the well to contain pressure in the reservoir until the well is completed and ready to be produced. The well is completed by installing a production tubing string in the well and carrying out certain procedures which will allow fluids to be produced from the reservoir and carried to the earth's surface through the tubing string. The term "completion," as used herein, is an arrangement of mechanical elements within the well which allows fluid to be produced from or injected into the reservoir. The configuration of the completion depends on reservoir depth, fluid type, and pressure. In general, the completion includes the production tubing string for transporting fluids from the reservoir or production zone to the surface and a packer for isolating an annular space between the casing and tubing string. The production tubing string is suspended within the production casing by a wellhead assembly. A valve system is normally mounted on the wellhead assembly. The valve system includes an assembly of valves and fittings used to control production, contain reservoir pressure, and provide access to the production tubing string. The completion may also include a sand control device, e.g., screen and/or gravel pack, which filters sand from the produced reservoir fluid.

Regardless of how the well is completed, it is desirable and important to monitor reservoir parameters while producing fluids from the reservoir. Reservoir parameters such as pressure, temperature, fluid flow rate, and other parameters which provide useful information about the development and behavior of the reservoir may be monitored. Monitoring reservoir parameters requires that one or more sensors which are responsive to the reservoir and/or fluid flow parameters to be measured are suitably positioned in the well, and communication between the sensors and the reservoir is established. The information gathered from analysis of the measured parameters may then be used to control and optimize production as well as to predict changes that may occur in the reservoir over a time period.

Typically, when it is desired to monitor a reservoir, one or more sensors are attached to one end of an electrical cable ("wireline") or coiled tubing, and the wireline or tubing is inserted into the well. Communication between the sensor and the reservoir is then established. The sensor takes measurements and transmits the measurements to the surface or to a data recorder that is coupled to the sensor. After measurements are taken, the sensor is retrieved from the well and the measured data are analyzed. Certain well-control functions may be performed depending on the results of the analysis.

An alternative approach to monitoring reservoir parameters contemplates a system which integrates reservoir-parameter monitoring and well-control functions within the completion system itself. Such "intelligent" completion systems include a downhole system and a surface system. The downhole system is made of various modules which are capable of monitoring and controlling flow of fluids from one or more production zones into the production tubing string. The surface system interfaces with the downhole system to determine the position, status, and/or flow characteristics in each production zone. The surface system may send a command to the downhole system to actuate certain subsurface devices to alter certain flow parameters. The downhole system may also automatically control flow in the well.

Intelligent completion systems require reliable power and data communications to the downhole system, particularly during production. One method for providing power and data communications to the downhole system is to run an electrical cable from the surface to the downhole system. The electrical cable typically consists of two main sections. One main section is coupled to the downhole system and the other main section is coupled to a control module at the earth's surface. To establish power and data communications between the downhole system and the control module, the two sections of the electrical cable must be connected. Typically, the connection is made at the wellhead, but it may also be made inside the wellbore itself. Making a connection inside the wellbore requires a "wet-mateable" electrical connector. In subsea completions, for example, the wellhead assembly and valve system are installed separately. Thus, a wet-mateable electrical connector is also required to make a connection at the wellhead. The electrical connection should be reliable to ensure reliable monitoring of reservoir parameters. For subsea completions, in particular, the electrical connection should be durable because the wellhead assembly and valve system are permanently installed on the sea floor. Also, the electrical connection should be able to insulate high voltage after being pressure sealed from conductive seawater and/or production fluid. This high voltage is often required for operation of downhole equipment and sensors.

The primary challenge in making wet electrical connections is how to protect the electrical contacts from influx of seawater and/or production fluid. This challenge has been addressed in a number of different ways. For example, U.S. Pat. No. 4,795,359 issued to Alcock et al. discloses an underwater electrical connector assembly having a male connector with a contact pin and a female connector with three closed chambers. The three closed chambers contain electrically insulating media, such as oil or grease. An electrically insulating shuttle piston extends through aligned holes in the three closed chambers and through a contact socket in one of the chambers. The shuttle piston is urged back when the contact pin of the male connector is engaged by the contact socket. An o-ring provides a seal between the holes in the chambers and the shuttle pin. The electrically insulating media provides a protected area around the connection between the contact pin and the contact socket. The chambers are made of a flexible membrane to permit variation of the pressure of the electrically insulating media inside them relative to the pressure outside the connector to reduce the tendency for water from the outside to enter the chambers.

U.S. Pat. No. 4,174,875 issued to Wilson et al., discloses a coaxial wet-mateable connector assembly wherein both the male and female connectors have concentric conductors. A rigid core dielectric material is disposed between the inner and outer male conductors for providing electrical insulation and a water-tight seal between them. An interconnection space is defined between the inner and outer female conductors. The female connector includes a spring-biased shuttle piston which is disposed and movable within the interconnection space. The shuttle piston has a central conductor with electrical contacts on either side for engaging the male and female inner conductors upon mating. To provide a fluid-tight seal between the shuttle piston and the female outer conductor before mating, a bulkhead is disposed within the interconnection space, adjacent the female outer conductor termination end. The bulkhead also provides a fluid-tight seal between the male inner conductor and the female outer conductor after mating, thereby preventing water from entering the interconnecting space. An o-ring seal wipes the male inner conductor clean of water as the male inner conductor drives the shuttle piston within the female housing until electrical interconnection between the male and female connectors is completed. A pressure compensating bladder removes fluid trapped within the interconnection surface during mating and returns the fluid to the interconnection surface during decoupling, thereby preventing a hydraulic lock between the male and female connectors.

U.S. Pat. No. 5,772,457 issued to Cairns discloses a pressure-balanced adapter for connecting two electrical connectors. The adapter comprises a shell having an internal chamber and a plurality of ports. The internal chamber has vents to the external environment. A plurality of electrically-conductive socket assemblies are disposed within the internal chamber, each in alignment with a respective one of the ports. Each of the socket assemblies has a piston which is movable in the port between an extended position and a retracted position. Each socket assembly is pressure-compensated to the ambient external pressure by means of one or more resilient bladders filled with dielectric fluid. Each socket assembly has one or more socket assembly vents. Each socket assembly also has contacts for engagement with electrical connectors. When the piston is in the extended position, it seals the port to prevent exposure of the socket assembly to the external environment. A flexible bladder containing dielectric fluid is disposed in the internal chamber and arranged to enclose at least the portion of each socket assembly in which the socket assembly vents are located. The exterior of the bladder is in fluid communication with the external environment through the chamber vents so that the pressure inside the socket assemblies is equalized with the pressure of the external environment.

Several other wet-mate type submersible electrical connectors are known in the art. See, for example, U.S. Pat. No. 4,039,242, U.S. Pat. No. 5,645,442, and U.S. Pat. No. 4,192,569. In general, prior art wet-mate type submersible electrical connectors use some type of elastomer component for sealing around a sliding piston, and also for the bladder (or membrane or diaphragm) component. The main purpose of the elastomer seal and bladder arrangement is to prevent intrusion of seawater and/or wellbore fluid into the electrical contact area. During long-term exposure to high pressure and temperature, however, well fluids, and/or moisture penetrate these elastomer seals and bladders, even though they are pressure-compensated and oil-filled. This moisture can easily build to the point where electrical short circuits can develop, causing connector failure. With the introduction of intelligent completion systems and advances in real-time well monitoring techniques, long-term dependability of this type of electrical connector has become crucial to the success of intelligent well completions.

SUMMARY OF THE INVENTION

In one aspect, the invention relates to a wet-mateable electrical connector which comprises a female connector body having an internal central cavity and a female metal sealing surface at a forward end. A female contact housing is disposed within the internal central cavity. The female contact housing includes one or more female contacts. A sliding pin is movably disposed within the internal central cavity. The wet-mateable connector further comprises a male contact pin having a front end for engagement with a front end of the sliding pin. The male contact pin includes one or more male contacts, each of which engages with a respective one of the female contacts during mating so as to establish electrical connection. The male contact pin has a male metal sealing surface which engages with the female metal sealing surface to form a metal-to-metal seal, thereby enclosing the male-to-female electrical contact area. The wet-mateable electrical connector further comprises a spring which applies a required force to the female connector body to activate the metal-to-metal seal.

In some embodiments, the wet-mateable electrical connector further comprises a metal bellows for pressure compensation and balancing between the internal central cavity and the exterior of the wet-mateable electrical connector. In some embodiments, the female connector body includes multiple female contacts and the male contact pin includes multiple male contacts, wherein each of the male contacts engages with a respective one of the female contacts to establish an electrical connection. In some embodiments, the male contact pin with all the multiple contacts embedded in it is molded as a one-piece solid body. In some embodiments, the wet-mateable electrical connector further comprises a wiper seal mounted at the forward end of the female connector body, wherein the wiper seal is arranged to provide effective wiping of the male contact pin prior to the male contact engaging the female contact.

Other aspects and advantages of the invention will be apparent from the following description and the appended claims.

DETAILED DESCRIPTION OF THE INVENTION

Figure 1A:
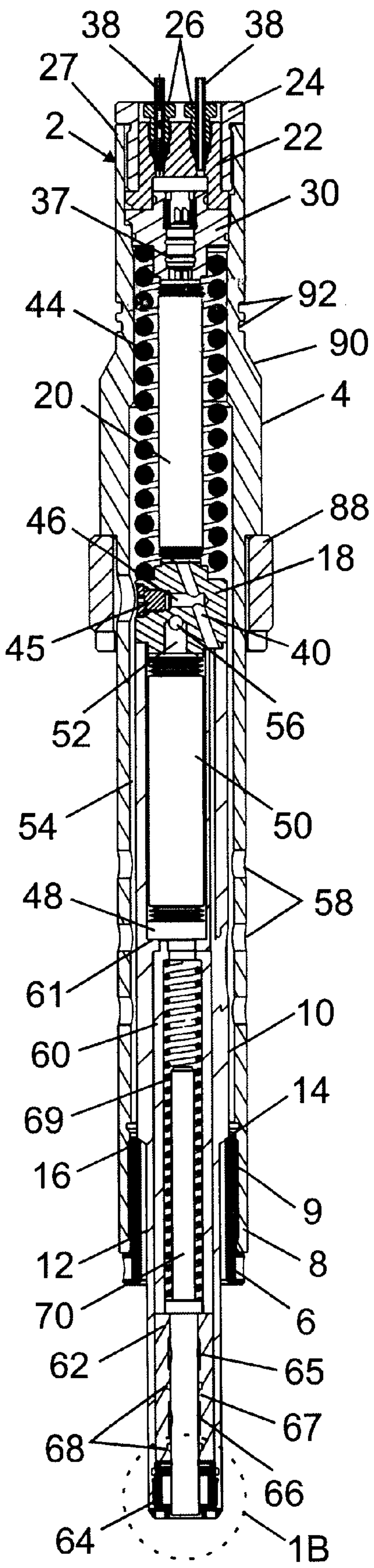
FIG. 1A depicts a cross-section view of a female connector assembly in accordance with one embodiment of the invention.

Various embodiments of the invention will now be described with reference to the accompanying figures. FIG. 1A shows a wet-mateable female connector 2 which includes an external housing 4. A load nut 6 is attached to the lower end 8 of the external housing 4 by a threaded connection 9. A female connector body 10 extends from within the external housing 4, through the bore 12 of the load nut 6, and projects outwardly from the lower end 8 of the external housing 4. The load nut 6 includes a tapered surface 14, which defines a seat for the female connector body 10. The tapered surface 14 touches a correspondingly tapered surface 16 on the female connector body 10. The axial position of the female connector body 10 relative to the external housing 4 can be changed by adjusting the threaded connection 9 between the load nut 6 and the external housing 4. A bellows bulkhead 18 is welded to the upper end of the female connector body 10. Above the bellows bulkhead 18 is a wire bellows 20. The wire bellows 20 has one end welded to the bellows bulkhead 18 and another end welded to an electrical feed-through bulkhead 30. The feed-through bulkhead 30 includes a weldable feed-through 37.

The feed-through bulkhead 30 is held in position by a seal bulkhead 22. The feed-through bulkhead 30 may be welded to the seal bulkhead 22 which provides high-pressure metal seals 26 for metal wire pass through tubes 38. The seal bulkhead 22 is held in place by a threaded cap 24. The seal bulkhead 22 is attached to the upper end 27 of the external housing 4 and welded. Electrical wires (not shown) pass through the metal wire pass-through tubes 38 in the metal seals 26 then through feed-through 37, wire bellows 20, passage 40 in the bellows bulkhead 18 into the female connector body 10 and then it reaches into the female contact housing 62. A main spring 44 is situated between the bellows bulkhead 18 and the feed-through bulkhead 30. The main spring 44 is compressed as the threaded connection 9 between the external housing 4 and the load nut 6 is adjusted. The load nut 6 is rotated to set the load on the main spring 44 to provide the required force for metal-to-metal sealing during connector engagement, and also to correct any allowable axial mis-alignments, as will be subsequently explained. The wire bellows 20 also deforms as the spring 44 deforms. One of the purposes of the wire bellows 20 is to provide an adjustable, through-wire, protective conduit for the electrical wires (not shown) inserted through the metal pass-through tubes 38 in the seal bulkhead 22. Also, the wire bellows 20 can provide flexibility between upper and lower segment of the female connector 2. The wire bellows 20, the feed-through bulkhead 30, and the passage 40 in the bellows bulkhead 18 are filled with a dielectric fluid such as insulating grease. The bulkhead 18 includes a port 46 through which the dielectric fluid can be inserted into the passage 40 and the other conduits connected to the passage 40, i.e., the interior of the wire bellows 20 and the female connector body 10 which includes the passage for the electrical wires (not shown). This fluid passage 40 extends internally all the way to a female contact area 67. A plug 45, in this embodiment a metal seal plug, is provided to seal the port 46 after filling the passage 40 with the dielectric fluid.

The female connector body 10 includes an internal central cavity 48. Inside the internal central cavity 48 is a metal bellows 50 for pressure balancing and compensation. The upper end of the metal bellows 50 is welded to the bellows bulkhead 18, and the lower end of the metal bellows 50 is sealed. The interior of the metal bellows 50 is connected to a passage 52 in the bellows bulkhead 18. The passage 52 communicates with an annular space 54 around the female connector body 10 through a port 56. The inside of the metal bellows 50 is in pressure communication with external fluid pressure through the passage 52, then port 56, then through annular space 54 around connector body 10, and then through ports 58. The internal central cavity 48 is filled with a dielectric fluid. When the pressure of the dielectric fluid inside the internal central cavity 48 exceeds the internal pressure in the metal bellows 50, the tool external fluid is forced out of the metal bellows 50 to the outside of the female connector 2. The opposite effect occurs when the pressure of the dielectric fluid inside the internal central cavity 48 falls below the pressure in the metal bellows 50. In this way, the pressure inside the female connector body 10 is balanced with the pressure outside the female connector 2.

A sleeve 60 is arranged below the compensating metal bellows 50. The upper end of the sleeve 60 touches a shoulder 61 in the female connector body 10. A female contact housing 62 is situated below the sleeve 60, and a wiper nose assembly 64 is mounted below the female contact housing 62. The upper end of the female contact housing 62 touches the lower end of the sleeve 60. The female contact housing 62 has an annular cross section. Electrical contacts 65 and 66 are situated on the inner surface 67 of the female contact housing 62. The electrical contacts 65, 66 are arranged in series on the inner surface 67 of the female contact housing 62 with a selected spacing related to the insulation requirements of the connector. Although only two electrical contacts are shown, it should be clear that more than two electrical contacts may be provided on the inner surface 67 of the female contact housing 62. The female contact housing 62 is made of an insulating material so as to prevent electrical conduction between the electrical contacts 65, 66. The female contact housing 62 with multiple electrical contacts 65, 66 can be molded as a one-piece solid body, preferably from a non-conductive material. Recesses are provided on the inner surface 67 of the female contact housing 62 for retaining rings 68. These retaining rings 68 provide a redundant internal wiper for a sliding pin 70. The sliding pin 70 extends from the wiper nose assembly 64, through the female contact housing 62, into the sleeve 60. The sliding pin 70 is pushed against the female contact housing 62 by a spring 69. The electrical contacts 65, 66 are each connected to one of the electrical wires (not shown) inserted through the metal tubes 38 in the seal bulkhead 22.

Figure 1B:
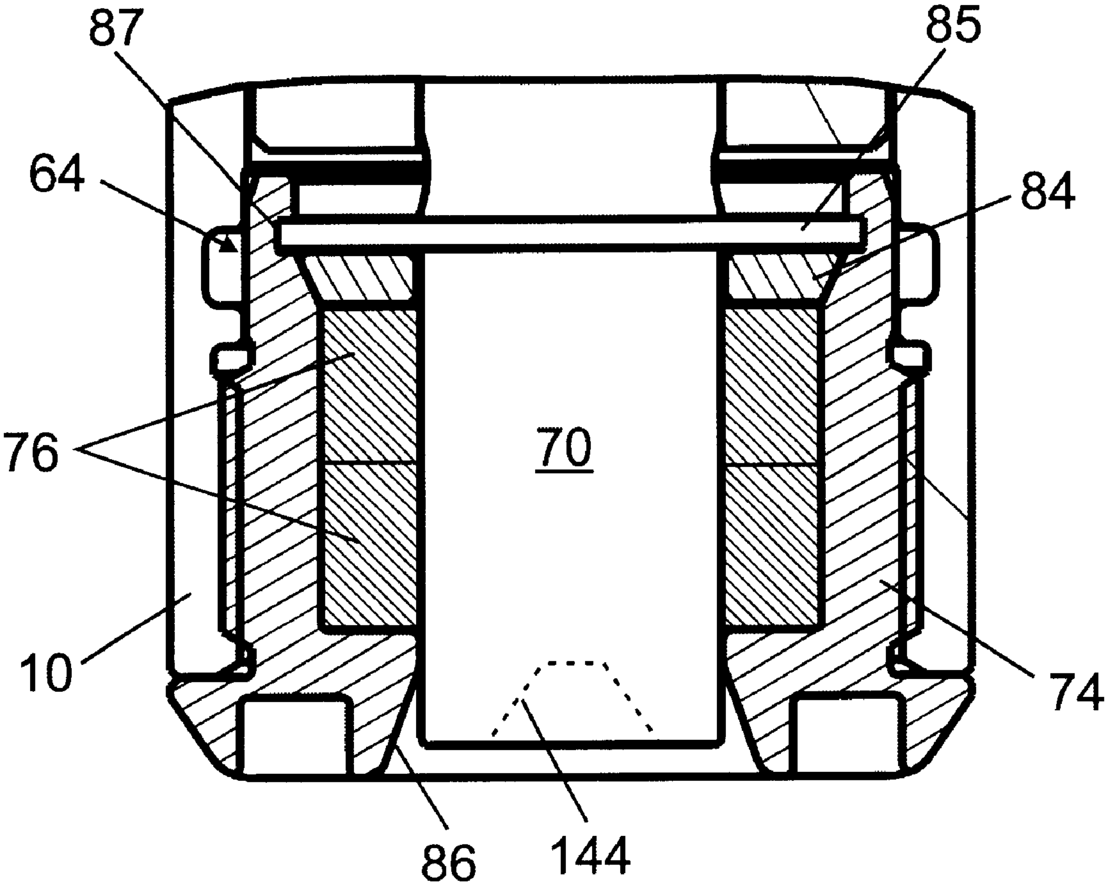
FIG. 1B is an enlarged view of the wiper assembly shown in FIG. 1A.

FIG. 1B shows an enlarged view of the wiper nose assembly 64. As shown, the wiper nose assembly 64 includes a wiper housing 74 which is thread installed and later welded to the bottom end of the female connector body 10. Annular wiper seals 76 are stacked inside the wiper housing 74. The annular wiper seals 76 are arranged to wipe the surface of the sliding pin 70 when the sliding pin 70 slides relative to the annular wiper seals 76. A retaining block 84 is mounted above the annular wiper seals 76. A retaining ring 85 is mounted above the retaining block 84 to secure the annular wiper seals 76 and the retaining block 84 in the wiper housing 74. The outer edge of the retaining ring 85 is fitted in a circumferential groove 87 in the wiper housing 74. Preferably, the wiper housing 74 is made of a corrosion-resistant material. At the bottom end of the wiper housing 74 is a female sealing surface 86. The female sealing surface 86 is generally conical in shape. The female sealing surface 86 is shaped to form a metal-to-metal seal with a corresponding sealing surface (not shown) on a male connector (not shown), as will be described below.

Depending on the particular application for the connector according to the invention, the female connector 2 (shown in FIG. 1A) may be attached to a body, e.g., a valve body (not shown), at a wellhead (not shown) or disposed within a wellbore (not shown). It should be noted that a mechanism is needed to attach the female connector 2 to the valve body (not shown). In the embodiment shown in FIG. 1A, the mechanism for attaching the female connector 2 to the valve body (not shown) includes a lock nut 88 engages with the external housing 4. In addition, a metal sealing surface 90 is provided on the external housing 4 for sealing engagement with the valve body (not shown). Grooves 92 are also provided for retaining o-ring seals (not shown). The lock nut 88 may be adjusted to facilitate sealing between the valve body (not shown) and the metal sealing surface 90 and the o-ring seals in the grooves 92. It should be clear, however, that the lock nut 88 is just one example of how the female connector 2 may be secured to a valve body (not shown). In general, the mechanism for attaching the female connector 2 to a valve body will be adapted to the particular design of the valve body.

Figure 2:
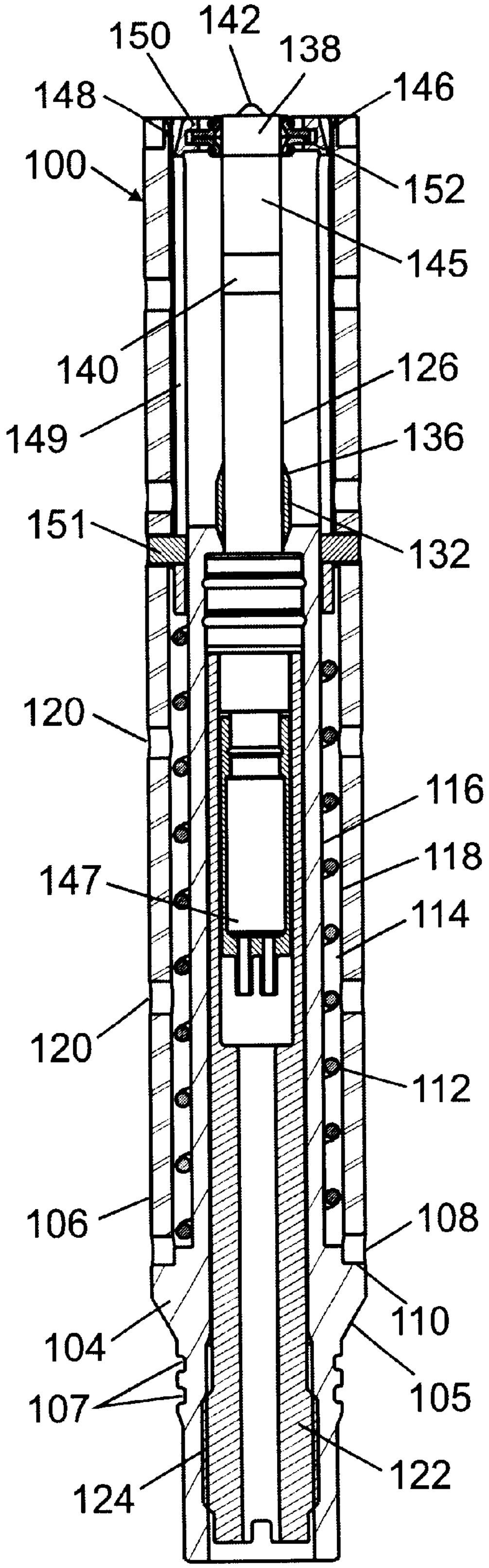
FIG. 2 depicts a cross-section view of a male connector assembly in accordance with one embodiment of the invention.

FIG. 2 shows a male connector 100 which includes a main housing 104. An external sleeve 106 has a lower end 108 welded onto an external shoulder 110 of the main housing 104. The external sleeve 106 includes ports 120 through which external pressure can be communicated to the chamber 114. A retainer sleeve 122 is secured within the main housing 104 by a threaded connection 124. A male contact pin 126 extends from the upper end of the external sleeve 106 into the retainer sleeve 122. A metal ferrule 132 is mounted on the male contact pin 126. The metal ferrule 132 includes a male sealing surface 136 which is adapted to form a metal-to-metal seal with the female sealing surface 86 (shown in FIG. 1B). The male sealing surface 136 is generally conical in shape and is made of a corrosion-resistant material. The metal ferrule 132 is welded to the upper side of the main housing 104.

The male contact pin 126 with multiple electrical contacts 138, 140 can be molded as a one-piece solid body, preferably from a non-conductive material. Electrical contact 140 has a nose end 142 which is adapted to fit within an aperture 144 (shown in FIG. 1B) in the leading end of the sliding pin 70 (shown in FIG. 1B). The electrical contacts 138 and 140 are insulated from each other by insulating material 145. The electrical contacts 138, 140 are connected to electrical wires (not shown) through a feed-through socket 147. The male connector body 100 may be filled with a dielectric fluid such as insulating grease.

A wiper assembly 146 is positioned between the male contact pin 126 and the external sleeve 106. The wiper assembly 146 includes a wiper housing 148 which is provided with an internal member 150 for installing elastomer wipers 152. The wiper housing 148 includes slots 149 which ride on pins 151 on the external sleeve 106. A spring 112 is disposed in a chamber 114 formed between the internal wall 116 of the external sleeve 106 and the outer wall 118 of the main housing 104. The spring 112 applies a force to the wiper housing 148 so as to keep the elastomer wipers 152 at the front of the male contact pin 126 prior to the male connector 100 engaging with the female connector 2 (shown in FIG. 1A), thereby keeping debris out of the male connector 100.

Depending on the application for the connector according to the invention, the male connector 100 (shown in FIG. 2) may be attached to a wellhead assembly (not shown) or disposed within a wellbore (not shown). In general, the main housing 104 will be adapted to fit within a designated area, e.g., a tubing hanger, in the wellhead assembly (not shown). The main housing 104 may include a metal sealing surface 105 which sealingly engages with a corresponding metal sealing surface (not shown) in the wellhead assembly (not shown). The main housing 104 may also include grooves 107 for retaining o-ring seals (not shown). The o-ring seals in the grooves 107 may provide an additional seal between the main housing 104 and the wellhead assembly (not shown).

Figure 3:
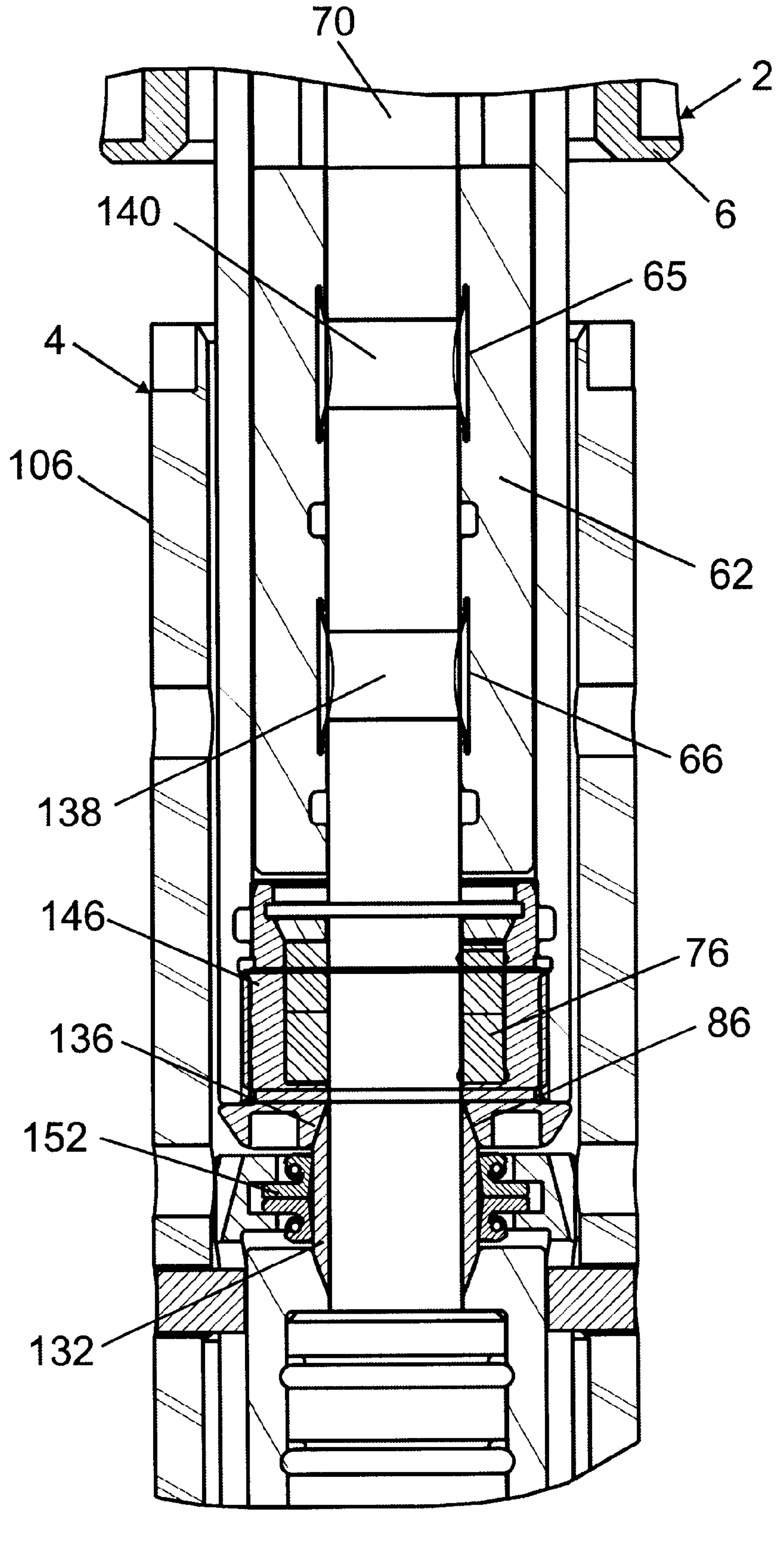
FIG. 3 shows the female connector of FIG. 1A and the male connector of FIG. 2 in a fully engaged position.

FIG. 3 shows the corresponding ends of the female connector 2 and the male connector 100 in their fully engaged position. Prior to actual mating engagement, the load nut 6 (shown in FIG. 1A) is adjusted to load the main spring 44 (shown in FIG. 1A) to the required spring force for sealing requirement. The female connector 2 is brought into stabbing engagement with the male connector 100 by lowering the female connector 2 onto the male connector 100, or vice versa. When the nose end 142 (shown in FIG. 2) of the male contact pin 126 engages with the aperture 144 (shown in FIG. 1B) in the leading end of the sliding pin 70, the force of the loaded main spring 44 acts on the female connector body 10 to push the wiper assembly 146 downward along the male contact pin 126. The wiper assembly 146 is pushed along the male contact pin 126 until the female sealing surface 86 engages with the male sealing surface 136 on the metal ferrule 132 around the male contact pin 100, thereby forming a metal-to-metal seal. Preferably, the metal ferrule 132 is formed from a corrosion-resistant material. In this position, the electrical contacts 65, 66 on the female contact housing 62 are connected to the electrical contacts 140, 138, respectively, on the male contact pin 100, thereby establishing an electrical connection.

As the female connector body 10 moves relative to the male contact pin 126, the elastomer wiper seals 76 wipe fluid off the male contact pin 145. During operation, the compensating metal bellows 50 (shown in FIG. 1A) provides pressure compensation. The compensating metal bellows 50 (shown in FIG. 1A) is preferably made of a corrosion-resistant material so that the performance of the metal bellows is not compromised even in the presence of seawater and/or other corrosive fluids.

The invention is advantageous when compared to prior art wet-mateable connectors because the high pressure metal-to-metal seal formed by the sealing surfaces 86 and 136 prevents seawater or other fluid from entering the electrical contact area without the use of elastomer sealing materials which are subject to moisture permeation and thermal degradation. The metal sealing surfaces 86 and 136 are preferably formed of a corrosion-resistant material. The metal-to-metal seal formed by the sealing surfaces 86 and 136 provides a long-term reliable sealed enclosure for the electrical contact area, even in the presence of seawater and/or other corrosive fluids, including wellbore production fluids. The metal-to-metal seal is energized by high concentration of force on the male sealing surface 136 by the loaded spring 44. With proper spring force, the metal-to-metal seal has been shown to be able to withstand a pressure of 15,000 psi at 350 degrees F.

The invention is also advantageous because it provides multiple electrical contacts on a single pin 126 and on a single sleeve 62. The wet-mateable electrical connector of the invention is suitable for use on land, with wellbores, and/or in subsea applications. The force applied to the metal sealing surface 136 by the loaded spring 44 may be suitably adjusted so that the metal-to-metal seal formed by the metal sealing surfaces 86 and 136 can withstand high pressures such as found in downhole environment.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A wet-mateable electrical connector, comprising:

a female connector body having an internal central cavity and a first metal sealing surface at a forward end;

a female contact housing disposed within the internal central cavity, the female contact housing including a female contact;

a sliding pin movably disposed within the internal central cavity; and a male contact pin having a front end for engagement with a front end of the sliding pin, the male contact pin including a male contact which engages with the female contact so as to establish an electrical connection, the male contact pin having a second metal sealing surface which sealingly engages the first metal sealing surface to form a metal-to-metal seal.

2. The wet-mateable electrical connector of claim 1, further comprising a metal bellows in metal-sealed engagement with the female connector body, the metal bellows for pressure balancing between the internal central cavity and the exterior of the wet-mateable electrical connector.

3. The wet-mateable electrical connector of claim 1, further comprising a wiper seal mounted at the forward end of the female connector body, the wiper seal being arranged to wipe the male contact pin prior to the male contact engaging with the female contact.

4. The wet-mateable electrical connector of claim 1, wherein the female contact housing is molded as a one-piece solid body.

5. The wet-mateable electrical connector of claim 1, wherein the male contact pin is molded as a one-piece solid body.

6. The wet-mateable electrical connector of claim 1, wherein the male contact pin is supported in a main housing.

7. The wet-mateable electrical connector of claim 6, wherein the main housing is provided with an external sealing surface.

8. The wet-mateable electrical connector of claim 1, further comprising a spring which applies a load to the female connector body to activate the metal-to-metal seal.

9. The wet-mateable electrical connector of claim 8, wherein the female connector body is movably coupled to an external housing.

10. The wet-mateable electrical connector of claim 9, further comprising a load nut coupled to the external housing, the load nut being operable to compress the spring so as to provide a selected value of the load required for activating the metal-to-metal seal.

11. The wet-mateable electrical connector of claim 9, wherein the external housing is provided with an external metal sealing surface.

12. The wet-mateable electrical connector of claim 9, further comprising a bulkhead in sealing engagement with the external housing, the bulkhead providing a metal-sealed pass-through tube for passing an electrical wire to the female contact.

13. The wet-mateable electrical connector of claim 12, further comprising a protective, adjustable conduit between the bulkhead and the female connector body for receiving the electrical wire.

14. A wet-mateable electrical connector, comprising:

a female connector body having an internal central cavity and a female metal sealing surface at a forward end;

a female contact housing including a plurality of female contacts, the female contact housing disposed within the internal central cavity;

a sliding pin movably disposed within the internal central cavity; and a male contact pin having a front end for engagement with a front end of the sliding pin, the male contact pin including a plurality of male contacts, each of the male contacts engaging with a respective one of the female contacts so as to establish an electrical connection, the male contact pin having a male metal sealing surface which sealingly engages the female metal sealing surface to form a metal-to-metal seal.

15. The wet-mateable electrical connector of claim 14, wherein the male contact pin is molded as a one-piece solid body.

16. The wet-mateable electrical connector of claim 14, wherein the female contact housing is molded as a one-piece solid body.

17. The wet-mateable electrical connector of claim 14, further comprising a metal bellows in metal-sealed engagement with the female connector body, the metal bellows for pressure balancing between the internal central cavity and the exterior of the wet-mateable electrical connector.

18. The wet-mateable electrical connector of claim 14, further comprising a wiper seal mounted at the forward end of the female connector body, the wiper seal being arranged to wipe the male contact pin prior to the male contacts engaging the female contacts.

19. The wet-mateable electrical connector of claim 14, wherein the male contact pin is supported in a main housing.

20. The wet-mateable electrical connector of claim 19, wherein the male contact housing is provided with an external metal sealing surface.

21. The wet-mateable electrical connector of claim 14, wherein the female connector body is movably coupled to an external housing.

22. The wet-mateable electrical connector of claim 21, further comprising a spring which applies a load to the female connector body and a load nut coupled to the external housing, the load nut being operable to compress the spring so as to provide a selected value of the load required for activating the metal-to-metal seal.

23. The wet-mateable electrical connector of claim 21, further comprising a bulkhead in sealing engagement with the external housing, the bulkhead providing metal-sealed pass-through tubes for passing electrical wires to the female contacts.

24. The wet-mateable electrical connector of claim 21, wherein the external housing is provided with an external metal sealing surface.

25. A wet-mateable electrical connector, comprising:

a female connector body having an internal central cavity and a female metal sealing surface at a forward end;

a female contact housing including a plurality of female contacts, the female contact housing disposed within the internal central cavity;

a sliding pin movably disposed within the internal central cavity;

a male contact pin having a front end for engagement with a front end of the sliding pin, the male contact pin including a plurality of male contacts, each of the male contacts engaging with a respective one of the female contacts so as to establish an electrical connection, the male contact pin having a male metal sealing surface which sealingly engages the female metal sealing surface to form a metal-to-metal seal; and a spring which applies a load to the female connector body to activate the metal-to-metal seal.

26. The wet-mateable electrical connector of claim 25, further comprising a metal bellows in metal-sealed engagement with the female connector body, the metal bellows for pressure compensation and balancing between the internal central cavity and the exterior of the wet-mateable electrical connector.

27. The wet-mateable electrical connector of claim 25, further comprising a wiper seal mounted at the forward end of the female connector body, the wiper seal being arranged to wipe the male contact pin prior to the male contact engaging with the female contact.

28. The wet-mateable electrical connector of claim 25, wherein the female contact housing is molded as a one-piece solid body.

29. The wet-mateable electrical connector of claim 25, wherein the male contact pin is supported in a main housing.

30. The wet-mateable electrical connector of claim 29, wherein the male contact pin is provided with an external metal sealing surface.

31. The wet-mateable electrical connector of claim 25, wherein the female connector body is movably coupled to an external housing.

32. The wet-mateable electrical connector of claim 31, further comprising a load nut coupled to the external housing, the load nut being operable to compress the spring so as to provide the load required for activating the metal-to-metal sealing.

33. The wet-mateable electrical connector of claim 31, further comprising a bulkhead in sealing engagement with the external housing, the bulkhead providing a metal-sealed pass-through tube for passing an electrical wire to the female contact.

34. The wet-mateable electrical connector of claim 31, wherein the external housing is provided with an external metal sealing surface.

35. A wet-mateable electrical connector, comprising:

a female connector body having an internal central cavity and a female metal sealing surface at a forward end;

a female contact housing including a plurality of female contacts, the female contact housing disposed within the internal central cavity;

a sliding pin movably disposed within the internal central cavity;

a male contact pin molded as a one-piece solid body, the male contact pin having a front end for engagement with a front end of the sliding pin, the male contact pin including a plurality of male contacts, each of the male contacts engaging with a respective one of the female contacts so as to establish an electrical connection, the male contact pin having a male metal sealing surface which sealingly engages the female metal sealing surface to form a metal-to-metal seal; and a spring which applies a load to the female connector body to activate the metal-to-metal seal.

36. The wet-mateable electrical connector of claim 35, wherein the female contact housing is molded as a one-piece solid body.

37. The wet-mateable electrical connector of claim 35, further comprising a metal bellows in metal-sealed engagement with the female connector body, the metal bellows for pressure balancing between the internal central cavity and the exterior of the wet-mateable electrical connector.

38. The wet-mateable electrical connector of claim 35, wherein the male contact pin is supported in a main housing.

39. The wet-mateable electrical connector of claim 35, further comprising a wiper seal mounted at the forward end of the female connector body, the wiper seal being arranged to wipe the male contact pin prior to the male contact engaging with the female contact.

40. The wet-mateable electrical connector of claim 35, wherein the female connector body is movably coupled to an external housing.

41. The wet-mateable electrical connector of claim 40, further comprising a load nut coupled to the external housing, the load nut being operable to compress the spring so as to provide a selected value of the load required for activating the metal-to-metal sealing.

42. The wet-mateable electrical connector of claim 40, further comprising a bulkhead in sealing engagement with the external housing, the bulkhead providing metal-sealed pass-through tubes for passing electrical wires to the female contacts.

* * * * *